United States Patent [19]

Maeda et al.

[11] Patent Number: 5,286,681
[45] Date of Patent: Feb. 15, 1994

[54] METHOD FOR MANUFACTURING SEMICONDUCTOR DEVICE HAVING A SELF-PLANARIZING FILM

[75] Inventors: Kazuo Maeda; Bunya Matsui; Yuko Nishimoto, all of Tokyo, Japan

[73] Assignee: Canon Sales Co., Inc., Tokyo, Japan

[21] Appl. No.: 901,329

[22] Filed: Jun. 19, 1992

[30] Foreign Application Priority Data

Jun. 20, 1991 [JP] Japan .................. 3-149013

[51] Int. Cl.⁵ .............................. H01L 21/02
[52] U.S. Cl. ...................... 437/240; 437/164; 437/982
[58] Field of Search ........... 437/982, 192, 164, 240, 437/235, 238

[56] References Cited

U.S. PATENT DOCUMENTS

| | | | |
|---|---|---|---|
| 4,474,831 | 10/1984 | Downey | 437/982 |
| 4,743,564 | 5/1988 | Sato et al. | 437/982 |
| 4,939,105 | 7/1990 | Langley | 437/228 |
| 4,966,865 | 10/1990 | Welch et al. | 437/192 |
| 4,985,373 | 1/1991 | Levinstein et al. | 437/982 |
| 5,094,984 | 3/1992 | Liu et al. | 437/982 |
| 5,132,774 | 7/1992 | Matsuura et al. | 257/758 |
| 5,166,101 | 11/1992 | Lee et al. | 437/238 |

FOREIGN PATENT DOCUMENTS

| | | |
|---|---|---|
| 0360992 | 4/1990 | European Pat. Off. |
| 0421203 | 4/1991 | European Pat. Off. |

OTHER PUBLICATIONS

Patent Abstracts of Japan, vol. 5, No. 181, "Semiconductor Device" J:56-108235, Yanai.
Patent Abstracts of Japan, vol. 9, No. 181, "Manufacture of Semi-Conductor Device " JP:60053050, Shiyouji et al.
Patent Abstracts of Japan, vol. 3, No. 58, "Semiconductor Device and its Manufacture" JP:54036183, Yasushi et al.

*Primary Examiner*—Robert Kunemund
*Assistant Examiner*—H. Jey Tsai
*Attorney, Agent, or Firm*—Sprung, Horn, Kramer & Woods

[57] ABSTRACT

The present invention relates to a method for manufacturing a semiconductor device, and more particularly to a method for forming a film used for flattening a substrate surface having unevenness in a manufacturing process of a semiconductor device, and has for its object to provide a method of manufacturing a semiconductor device for making it possible to flatten a film by processing at a lower temperature without deteriorating the film quality.

The present invention is structured including a process of depositing a film composed of BPSG or PSG on a substrate surface having unevenness, a process of depositing a $SiO_2$ film or depositing a film composed of BPSG or PSG having concentration lower than phosphorus concentration or boron concentration in the film or a $SiO_2$ film on the film, and a process of melting and fluidizing these films so as to flatten them by applying heat treatment.

6 Claims, 12 Drawing Sheets

FIG. 4(a)
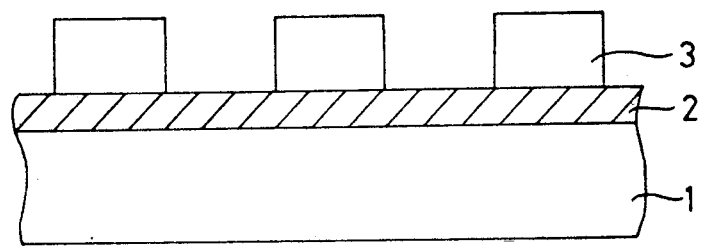
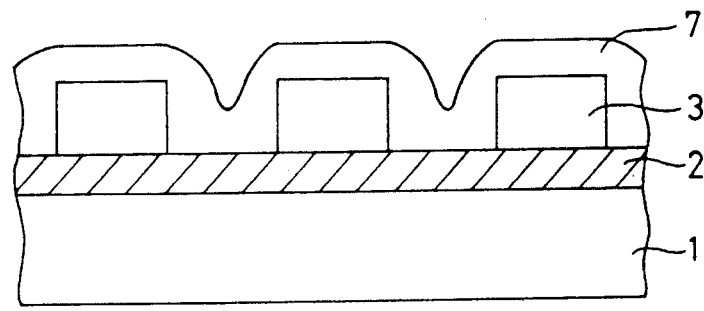
FIG. 4(b)
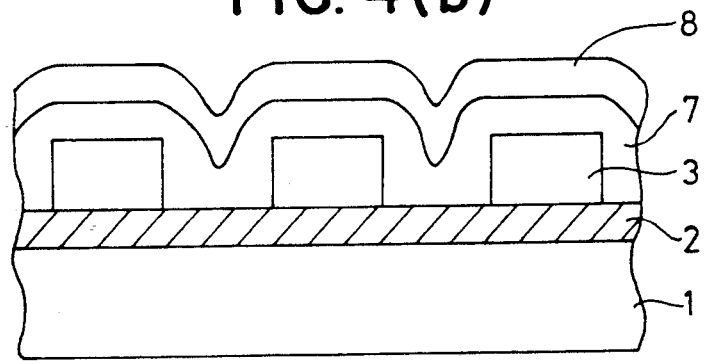
FIG. 4(c)

F I G. 6
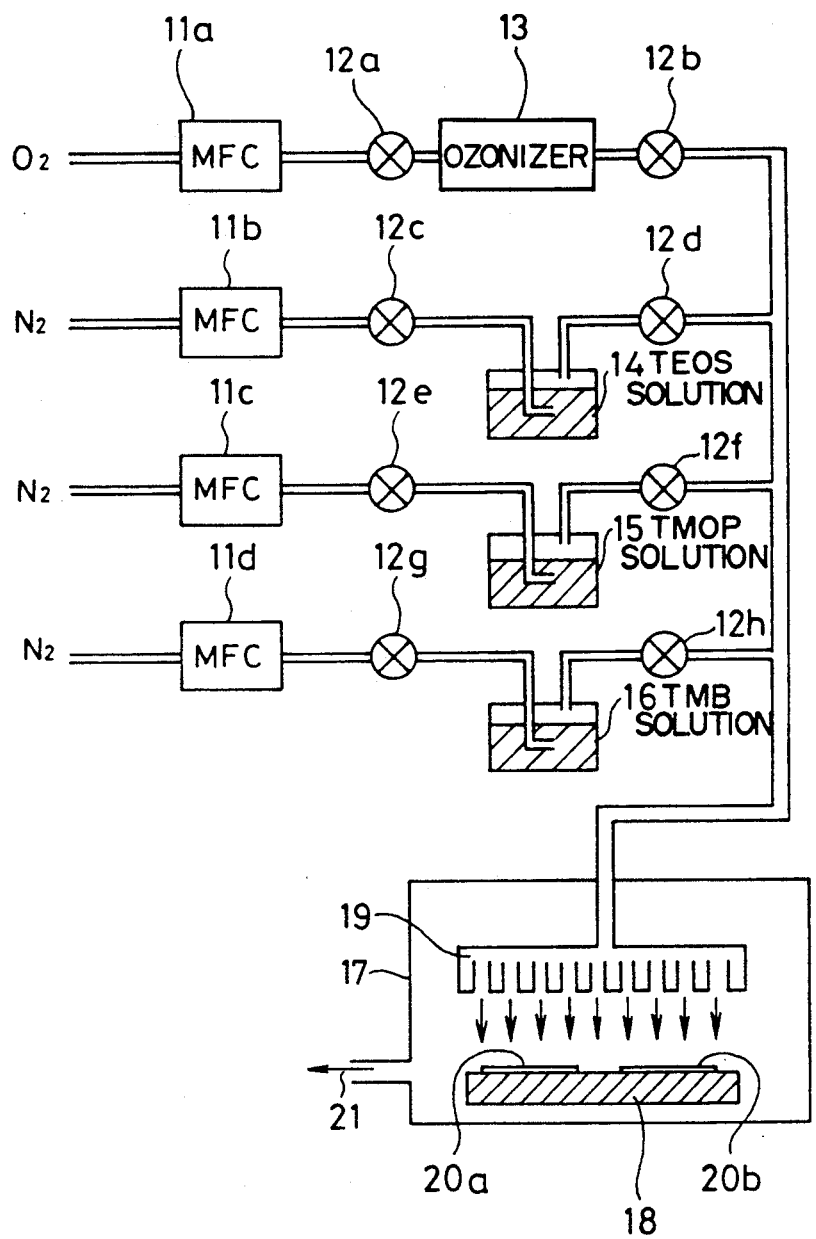

α : REFLOW ANGLE

METHOD FOR MANUFACTURING SEMICONDUCTOR DEVICE HAVING A SELF-PLANARIZING FILM

BACKGROUND OF THE INVENTION

The present invention relates to a method for manufacturing a semiconductor device, and more particularly to a method for forming a film used for flattening a substrate surface having unevenness in a manufacturing process of a semiconductor device.

Formation of a very fine pattern and a multilayer interconnection structure are demanded according as high densification and high integration of a semiconductor device in recent years, and a tendency that the unevenness of the substrate surface becomes still more conspicuous is being developed.

However, as the unevenness of the substrate surface becomes more conspicuous, it becomes more difficult to form a highly precise fine pattern and disconnection of interconnection and the like are also liable to occur. Therefore, lowering of reliability of a device and lowering of yield of semiconductor devices are caused. Thus, techniques for flattening the substrate surface are required.

In the early stage of flattening techniques, a PSG film obtained by adding phosphorus to a $SiO_2$ film has been used as a flattening film which is able to flatten a substrate surface at a comparatively low temperature. This PSG film has a nature that the flattening temperature is lowered by increasing an addition quantity of added phosphorus, but the film absorbs moisture and the film quality is deteriorated when the addition quantity of phosphorus is increased, thus becoming unfit for practical use. In a PSG film having phosphorus concentration showing no deterioration of the film quality, the softening point is approximately 1,000° C. at the most. Thereupon, a BPSG film obtained by adding both boron and phosphorus having a softening point lower than that of the PSG film has been developed as a flattening film. For example, a flattening temperature at approximately 850° C. has been obtained by adding boron and phosphorus into a $SiO_2$ film at 3 to 4 mol %, respectively, and the foregoing is the main current of present techniques of flattening a VLSI as a low temperature process.

FIG. 12 shows diagrams showing a process of flattening a BPSG film by means of reflow related to a conventional example. In FIG. 12(a), a $SiO_2$ film 23 is formed on a Si substrate 22, and a polysilicon film 24 formed in a pattern is formed on the $SiO_2$ film 23. Next, a BPSG film 25 is formed by a Chemical Vapor Deposition (CVD) method as shown in FIG. 12(b).

Next, when heat treatment (reflow processing) is applied at 850° C. for about one hour in nitrogen ($N_2$) atmosphere, the BPSG film 25 is softened, melted and fluidized. Thus, the substrate surface is flattened. Further, the film quality of the heat treated BPSG film is made fine, thus forming a film of good quality having no hygroscopic property. When the substrate surface is flattened as described above, it becomes possible to make the pattern of interconnector or film formed thereon fine, thus enabling to manufacture a highly reliable semiconductor device having little disconnection and short-circuit of interconnection.

Hereupon, as refinement of a device is advanced, a low temperature, and consequently a still lower temperature of the flattening temperature (reflow temperature) becomes required, and it is demanded in recent years to obtain the flattening temperature at 800° C. or below. With respect to a BPSG film ($SiO_2$-$B_2O_3$-$P_2O_5$), the softening temperature can also be lowered by increasing the concentration of B($B_2O_3$) and P($P_2O_5$) in the film similarly to the case of the PSG film.

FIG. 8(b) shows experimental data showing the relationship between the total quantity of impurities ($P_2O_5$+$B_2O_3$) contained in a BPSG film and a reflow angle α at the reflow temperature of 900° C. (parameter is boron concentration), and a tendency that the reflow angle α becomes smaller as the total quantity of impurities ($P_2O_5$+$B_2O_3$) is increased, i.e., a tendency of being flattened is shown as shown in FIG. 8(b). Besides, FIG. 8(a) is a diagram for explaining the definition of the reflow angle. However, as the impurity quantity increases, hygroscopic property of the film becomes higher, and phenomena such as precipitation ($B_2O_3$ or boric acid, etc.), moisture absorption (generation of $H_3PO_4$) and clouding on the surface (devitrification) become liable to be presented, which cause an obstacle in the next process. Namely, an unstable process is caused, and there are many problems in point of the reliability of the device, too.

FIG. 9 and FIG. 10 are diagrams for explaining the foregoing, and show the relationship between phosphorus concentration/boron concentration and film quality stability of the BPSG film. The axis of abscissa represents boron concentration (mol %), the axis of ordinate represents phosphorus concentration (mol %), and the characteristic curve shows a boundary whether the film quality is stable or not. Namely, the instability of the film quality is increased when going in the right upper direction with the curve as the boundary, and the film quality is stabilized more when going in the left under direction. The characteristic curve was determined by whether the film quality of the BPSG film was deteriorated or not within one week after the BPSG film was deposited. As described, the film quality is deteriorated in general as the phosphorus concentration/the boron concentration is increased. Besides, the substrate temperature when the BPSG film is deposited is used as the parameter in FIG. 9, and the ozone concentration when the BPSG film is deposited is used as the parameter in FIG. 10.

Further, FIG. 11 shows experimental data (parameters are boron concentration and phosphorus concentration) showing the relationship between the reflow temperature and the reflow angle α, and shows a tendency of being flattened as the reflow temperature is increased as shown in FIG. 11 (F. S. Becker, D. Pawlik, H. Schafer and G. Standigl J. Vac. Technol. B4(3), 1986, pp. 732-744).

It has been in such a dilemma that, when the phosphorus concentration/the boron concentration is increased aiming at a low temperature, the film quality is deteriorated thereby to affect the device, and, when the phosphorus concentration/the boron concentration is decreased, reflow at a high temperature is compelled as described above. A limit is placed to 850° C. at present for the reflow temperature of the BPSG film at concentration showing no deterioration of the film quality.

It is an object of the present invention to provide a method of manufacturing a semiconductor device which is able to lower a reflow temperature by utilizing a BPSG film or a PSG film having high impurity concentration as a flattening film.

Further, it is another object of the present invention to provide a method of manufacturing a semiconductor device which is able to arrange so that a BPSG film or a PSG film of high impurity concentration including a drawback that the film quality is deteriorated by moisture absorption does not absorb moisture.

SUMMARY OF THE INVENTION

A method for manufacturing a semiconductor device of the present invention comprises a process of depositing a $SiO_2$ film doped with impurities on a substrate surface having unevenness, a process of depositing a moisture resistant film so as to cover the $SiO_2$ film doped with impurities, and a process of melting and fluidizing the $SiO_2$ film doped with impurities and the moisture resistant film so as to flatten the surfaces thereof by applying heat treatment.

The present invention is characterized in that the $SiO_2$ film doped with impurities is a PSG film or a BPSG film and also in that the moisture resistant film is a $SiO_2$ film doped with impurities having low concentration rather than a $SiO_2$ film or a $SiO_2$ film doped with impurities which is an object of covering.

A method for manufacturing a semiconductor device of the present invention is characterized in that, after a $SiO_2$ film doped with impurities is deposited on a substrate surface having unevenness, processing is shifted to a process of depositing a next moisture resistant film in a state that the deposited film is protected against the atmosphere so that it does not absorb moisture.

Further, the present invention is characterized in that the film thickness of the moisture resistant film is thinner than the film thickness of the $SiO_2$ film doped with impurities which is the object of covering.

Moreover, a method for manufacturing a semiconductor device of the present invention is characterized in that the extent of unevenness on the substrate surface is reduced in advance by forming a film having self-flattening property before the process of depositing the $SiO_2$ film doped with impurities.

In the next place, the principle of the present invention will be described with reference to FIG. 1.

FIG. 1(a) shows a deposited state of a film on a substrate I before reflow treatment. Namely, a BPSG film II having a film thickness of 8,000 Å is formed on the substrate I, and the boron concentration and the phosphorus concentration (boron concentration: 4 mol %; phosphorus concentration: 4 mol %) showing the flattening temperature at 800° C. are contained in the film II. Further, a $SiO_2$ film III having a film thickness of 300 Å is formed on the BPSG film II as a protective film of the BPSG film II. In FIG. 1, the axis of abscissas represents the film thickness, and the axis of ordinates represents the impurity concentration in the BPSG film II.

Now, it is important to form the $SiO_2$ film III on the BPSG film II while maintaining the state that the BPSG film II is not exposed to the atmosphere. Accordingly, for example, the $SiO_2$ film III may be grown continuously in a same furnace without taking the substrate I outside after forming the BPSG film II, or may be grown in a different furnace in case it is not exposed to the atmosphere by load lock and the like. Since the BPSG film II is covered by the $SiO_2$ film III in either case, the film quality thereof is prevented from being deteriorated by absorbing moisture in the atmosphere.

Besides, the BPSG film II does not touch the atmosphere directly and absorb moisture after the BPSG film II is covered by the $SiO_2$ film III. Therefore, there is no problem even if wafers are exposed to the atmosphere while the wafers are being moved for next reflow processing.

FIG. 1(b) shows a state of a film on the substrate I after heat treatment (reflow processing) at 800° C. for 30 minutes after the process shown in FIG. 1(a). When heat treatment is applied as described above, $B_2O_3$, $P_2O_5$ and the like in the BPSG film II are taken into the $SiO_2$ film III and vitrified. Thus, a new BPSG film VI is formed, and the BPSG film VI is melt and fluidized thereby to be flattened. Further, the BPSG film quality becomes fine so as to show less hygroscopic property by heat treatment at a high temperature of 800° C. at the same time, thus making it possible to form a stable BPSG film having no precipitation and devitrification. Since the reflow temperature of the BPSG film VI covered by the $SiO_2$ film III having a thin film thickness is at almost the same reflow temperature of the BPSG film VI which is not covered by the $SiO_2$ film III as described above, it becomes possible to flatten the substrate surface at a low temperature without deteriorating the film quality.

BRIEF DESCRIPTION OF THE DRAWINGS

FIGS. 4a–4c shows explanatory diagrams (1) for explaining a method of manufacturing a semiconductor device according to the second embodiment of the present invention;

FIG. 6 is a schematic diagram of a manufacturing apparatus applied with a method of an embodiment of the present invention;

DESCRIPTION OF THE PREFERRED EMBODIMENTS

In the next place, embodiments of the present invention will be described with reference to the drawings.

FIG. 6 is a schematic block diagram of a semiconductor manufacturing apparatus used in a method of manufacturing a semiconductor device according to an embodiment of the present invention. In FIG. 6, 11a to 11d represent flow meters (MFC), 12a to 12h represent valves, 13 represents an ozonizer for changing oxygen ($O_2$) into ozone ($O_3$), 14 represents a Tetraethylorthosilicate (TEOS) solution set at a temperature of 40° C. to 65° C., 15 represents a Trimethylphosphate (TMOP) solution set at approximately 50° C. to 60° C., and 16 represents a Trimethylborate (TMB) solution set at approximately 5° C. to 50° C.

Further, 17 represents a chamber, 18 represents a heater, 19 represents a gas outflow head, 20a and 20b represent wafers which become the objects of film formation, and 21 represents a gas exhaust port.

Figure 7:
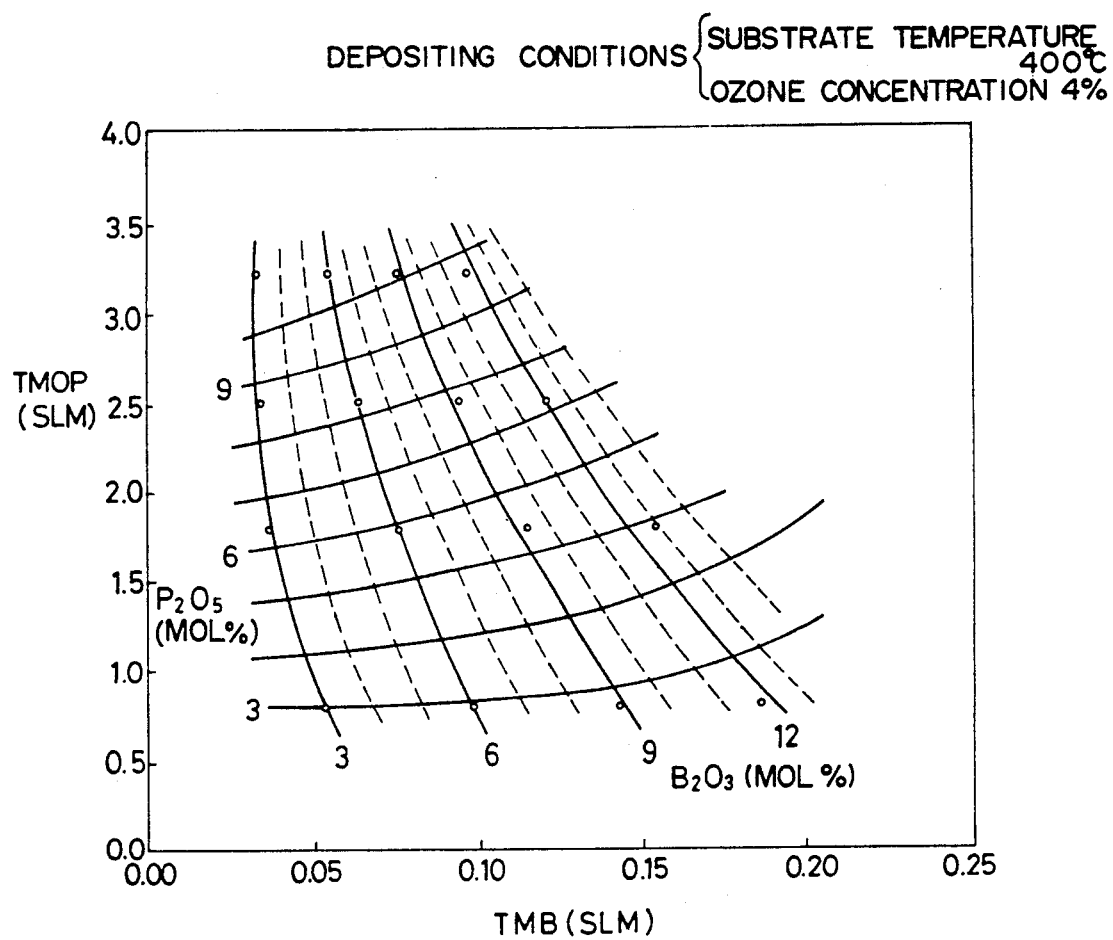
FIG. 7 is a diagram showing the relationship between the flow rate of TMB/TMOP and the impurity concentration in the BPSG film.
Figure 8A:
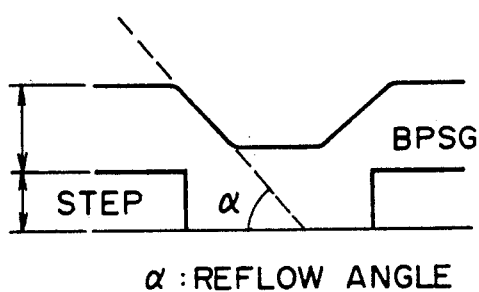
FIGS. 8a–8b shows Diagrams showing the relationship between the total impurity quantity in a BPSG film and a reflow angle $\alpha$.
Figure 8B:
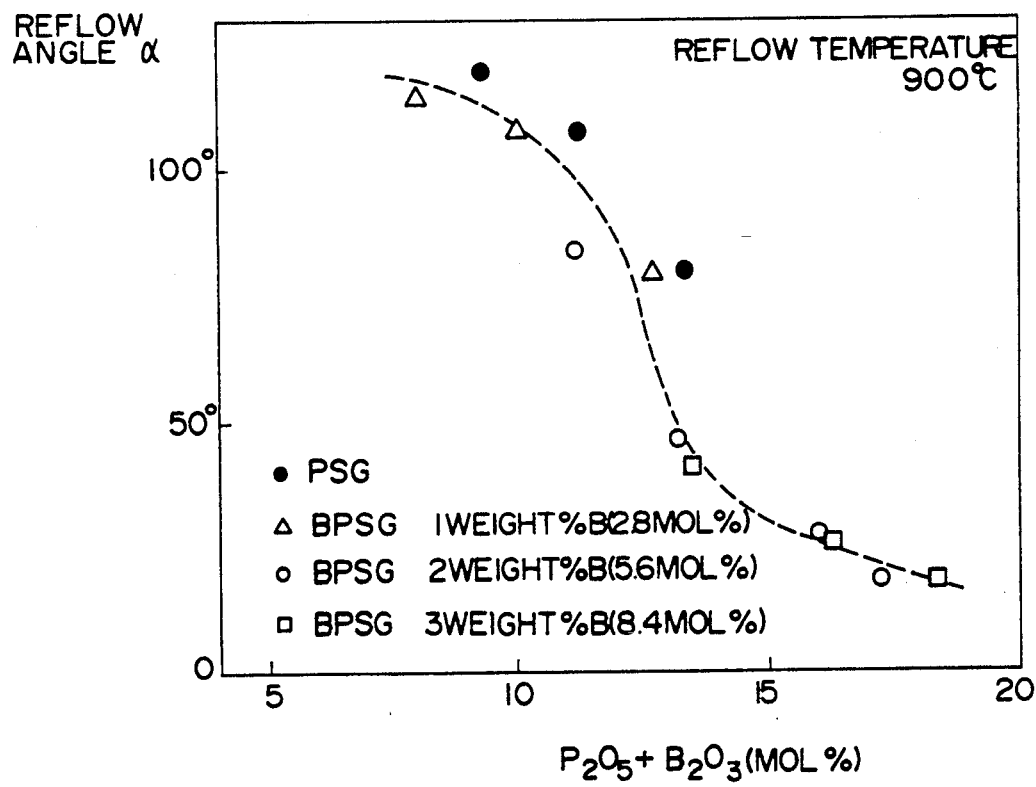
Figure 9:
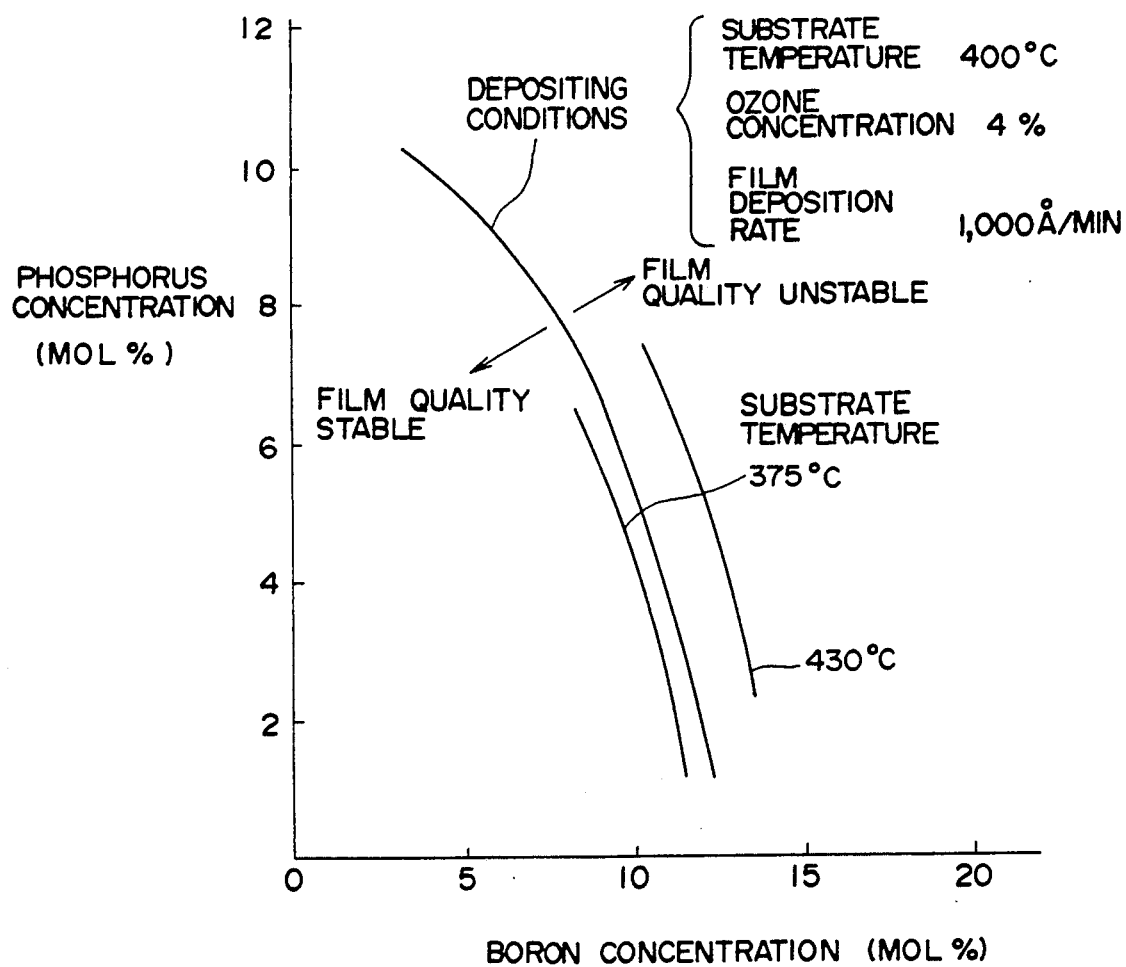
FIG. 9 is a diagram (1) showing the relationship between phosphorus concentration/boron concentration and film quality stability of a BPSG film.
Figure 10:
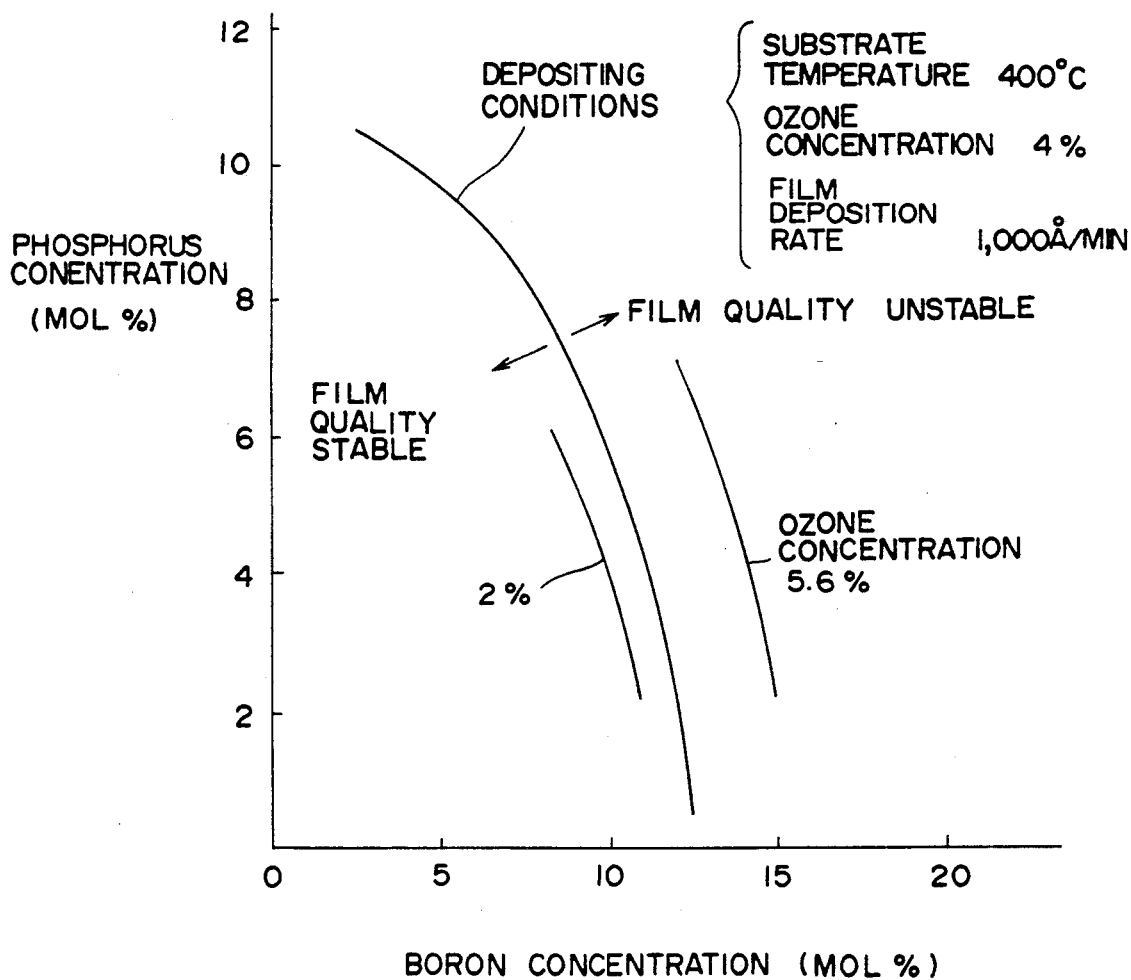
FIG. 10 is a diagram (2) showing the relationship between phosphorus concentration/boron concentration and film quality stability of a BPSG film.
Figure 11:
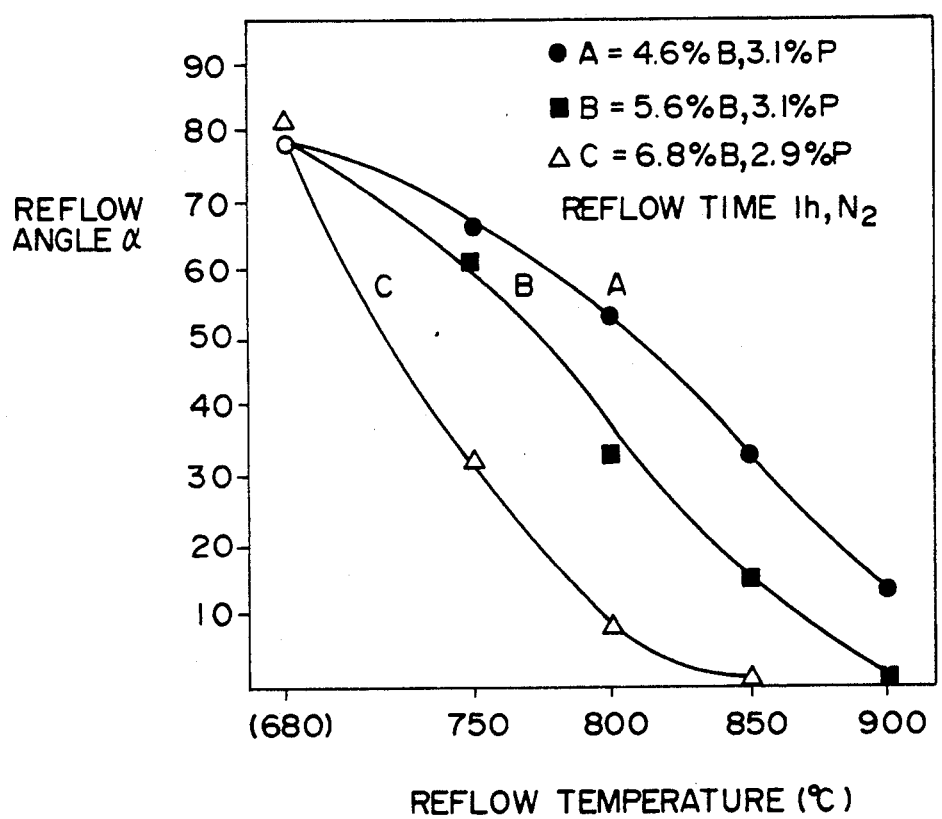
FIG. 11 is a diagram showing the relationship between a reflow temperature and a reflow angle $\alpha$.
Figure 12A:
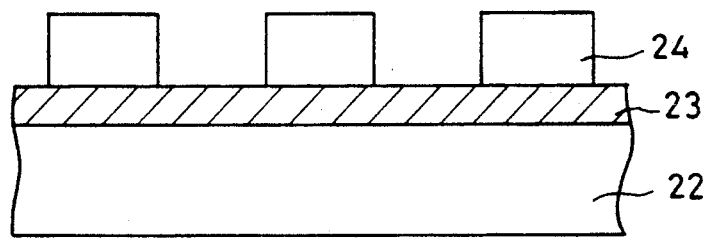
FIGS. 12a–12c shows explanatory diagrams of a conventional example.
Figure 12B:
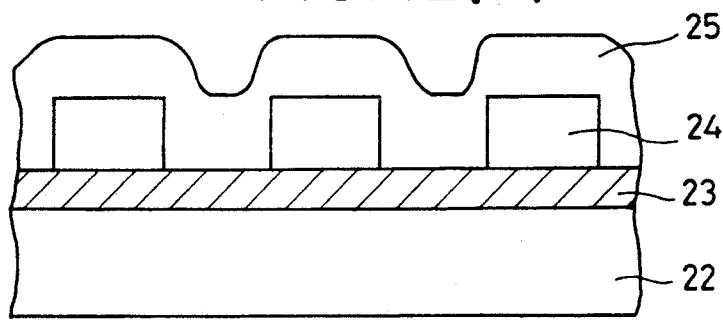
Figure 12C:
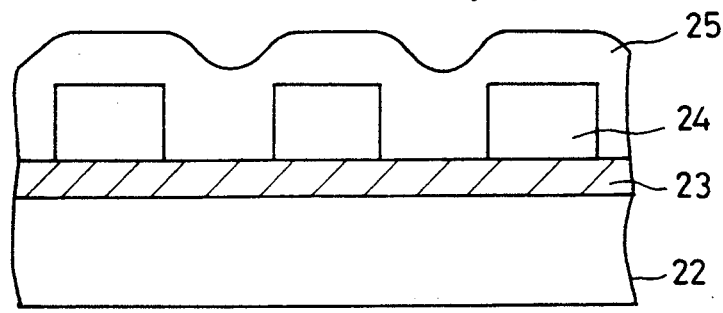

FIG. 7 shows results of experiment showing the relationship between flow rate of TMB/flow rate of TMOP and impurity concentration contained in a BPSG film when the BPSG film is deposited using the manufacturing apparatus of a semiconductor device shown in FIG. 6. In FIG. 7, the axis of abscissas represents the flow rate of TMB (SLM; litter/min.) and the axis of ordinates shows the flow rate of TMOP (SLM; litter/min.), and numeric values shown at the ends of respective curves (the solid line shows $B_2O_3$ and the broken line shows $P_2O_5$) show the concentration in the film.

(1) The first embodiment of the present invention

Figure 1A:
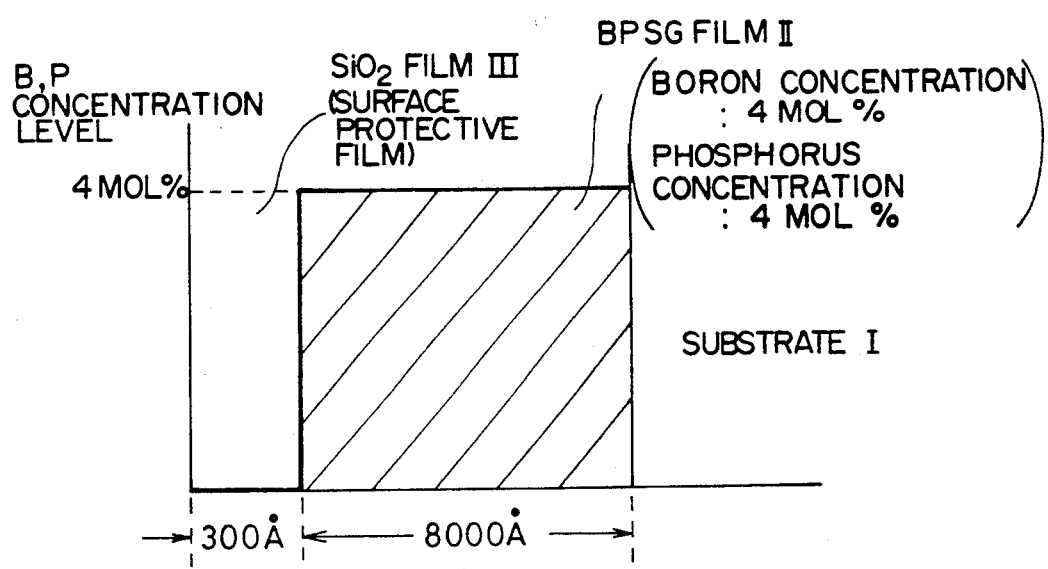
FIGS. 1a–1b shows diagrams for explaining the operation of the present invention.
Figure 1B:
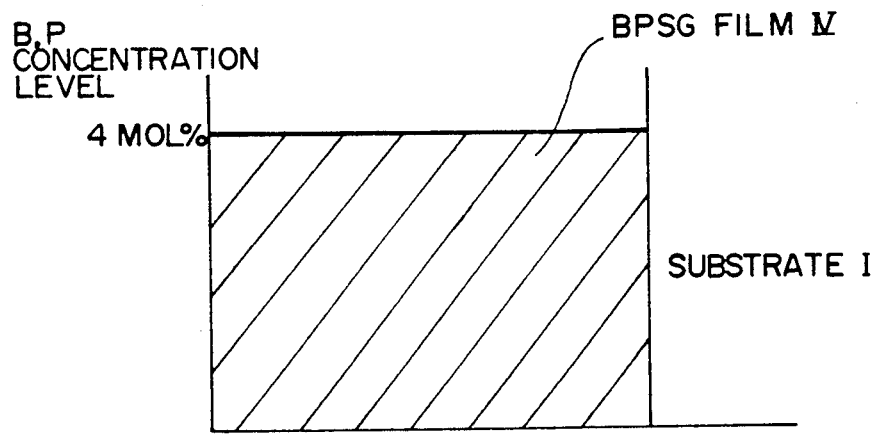
Figure 2A:
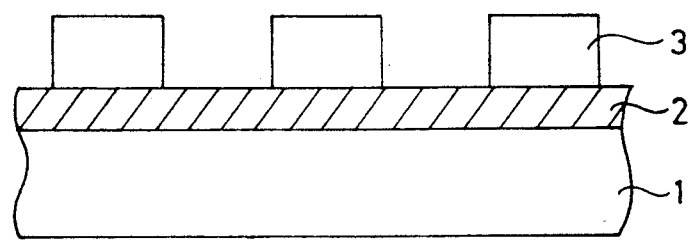
FIGS. 2a–2c shows explanatory diagrams (1) for explaining a method of manufacturing a semiconductor device according to the first embodiment of the present invention.
Figure 2B:
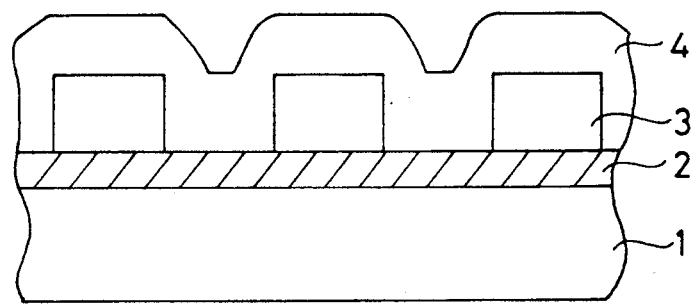
Figure 2C:
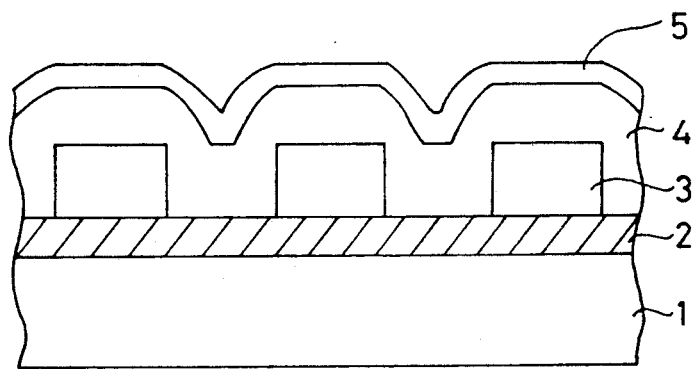

FIG. 2 shows process drawings for explaining a method for manufacturing a semiconductor device according to the first embodiment of the present invention. A method for manufacturing a semiconductor device according to an embodiment of the present invention will be described with respect to the apparatus for manufacturing a semiconductor device shown in FIG. 6 and with reference to depositing conditions of the BPSG film shown in FIG. 7.

First, a polysilicon film 3 having a film thickness of 1 $\mu$m is formed on a $SiO_2$ film 2 formed on a Si substrate I, and patterning is applied to the polysilicon film. Next, the Si substrate I (wafers 19a and 19b in FIG. 6) is housed in a chamber 17 shown in FIG. 6, TEOS gas, TMOP gas, TMB gas and $O_3$ gas are let flow by opening valves 12a to 12h, and flow meters 11a to 11d are regulated with reference to depositing conditions shown in FIG. 7. Thus, a BPSG film 4 having boron concentration at 4 mol % and phosphorus concentration at 4 mol % is deposited in a thickness of 8,000 Å on a polysilicon film 3 at the substrate temperature of 400° C. by a CVD method of TEOS-TMOP-TMB-$O_3$ system (FIG. 2(b)). Then, the impurity gas (TEOS gas, TMOP gas) is stopped to be supplied while holding the wafers in the chamber 17, and a $SiO_2$ film 5 having a thickness of 500 Å is deposited on the BPSG film 4 at the substrate temperature of 400° C. This $SiO_2$ film 5 functions as a capping film for protecting the $SiO_2$ film 4 against moisture. Next, the wafers are taken out of the chamber 17 and moved to another high temperature processing furnace (not shown). The wafers may come in touch with the atmosphere at this time.

Figure 3:
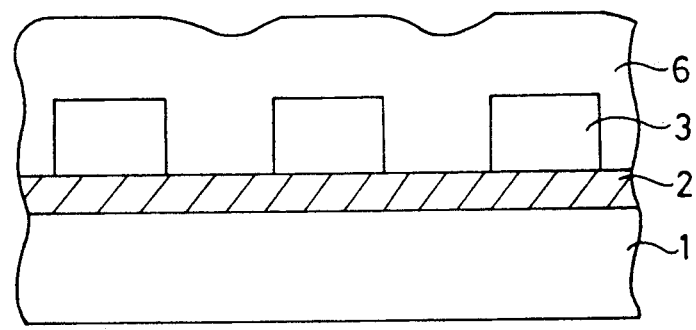
FIG. 3 is an explanatory diagram (2) for explaining a method of manufacturing a semiconductor device according to the first embodiment of the present invention.

Then, reflow processing is performed at 800° C. and for 30 minutes in $N_2$ atmosphere. With this, as shown in FIG. 3, $P_2O_5$, $B_2O_3$ and the like in the BPSG film 4 also move into the $SiO_2$ film 5 and vitrified, and reflow as a BPSG film 6 uniformalized as the whole. Thus, the substrate surface is flattened. When the substrate surface is flattened in such a manner, it becomes possible to refine the interconnection pattern and the film pattern formed in and after next process, and to aim at higher integration of the semiconductor device. The film quality of the BPSG film 6 is made fine by heat treatment to generate reflow at the same time. Therefore, even if the film is exposed to the atmosphere in a process thereafter, the BPSG film 6 absorbs moisture and the film quality will never be deteriorated.

Besides, the reflow temperature at this time is almost the same as the temperature at which the BPSG film reflows independently, and is hardly influenced by the existence of the $SiO_2$ film 5. Namely, since reflow at a low temperature is possible similarly to the case of the BPSG film alone, it is possible to realize a process at a low temperature. This is considered that the reflow temperature becomes almost the same as the case of the original BPSG film 4 because of the fact that $P_2O_5$ and $B_2O_3$ in the BPSG film 4 also move into $SiO_2$ film 5 by reflow processing and are taken therein so that a new BPSG film 6 is formed, and the concentration of $P_2O_5$ and $B_2O_3$ in this new BPSG film 6 is at an almost the same value of the concentration of $P_2O_5$ and $B_2O_3$ in the original BPSG film 4 since the film thickness of the $SiO_2$ film 5 is thin as compared with the film thickness of the BPSG film 4. Such a fact has been confirmed by the analysis of impurity distribution in the BPSG film 6 after reflow. Further, it has been ascertained through experiment that there is almost no difference in the configuration (flatness) of the film after reflow irrespective of the existence of the $SiO_2$ film 5 having a thickness of 500 Å.

As described above, according to a method of manufacturing in the first embodiment of the present invention, the film quality is not deteriorated even if a BPSG film of high impurity concentration is used, and the substrate surface can be flattened by having it reflow at a low temperature. Thus, such a method will go far toward lowering the temperature of a semiconductor process and refinement of a semiconductor device.

(2) The second embodiment of the present invention

FIG. 4 shows process diagrams for explaining a method for manufacturing a semiconductor device according to the second embodiment of the present invention.

First, as shown in FIG. 4(a), a polysilicon film 3 having a film thickness of 1 $\mu$m is formed on a $SiO_2$ film 2 formed on a Si substrate I, and patterning is applied to the polysilicon film.

Figure 5A:
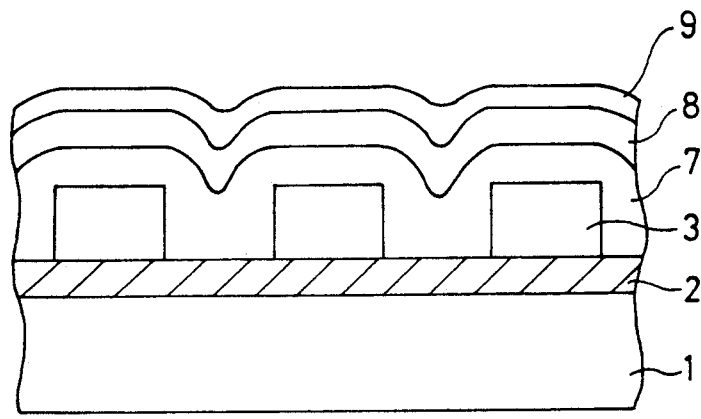
FIGS. 5a–5b shows explanatory diagrams (2) for explaining a method of manufacturing a semiconductor device according to the second embodiment of the present invention.

Next, as shown in FIG. 4(b), a $SiO_2$ film having self-flattening property is formed in a thickness of 2,000 Å on the polysilicon film 3 by an atmospheric CVD method. Here, the film having self-flattening property means a film having a tendency showing flow configuration by itself during film formation, which can be formed by TEOS/$O_3$ atmospheric CVD method for instance. According to this method, a film configuration similar to that of a film applied with high temperature reflow processing at a film formation temperature of approximately 400° C. Then, in a similar manner as the embodiment 1, the Si substrate I (wafers 19a and 19b) are housed in the chamber 17 shown in FIG. 6, TEOS gas, TMOP gas, TMB gas and $O_3$ gas are let flow by opening valves 12a to 12h, and flow meters 11a to 11d are regulated with reference to depositing conditions shown in FIG. 7. In such a manner, a BPSG film 8 having boron concentration at 6 mol % and phosphorus concentration at 5 mol % is deposited on the polysilicon film 3 in the thickness of 7,000 Å at the substrate temperature of 400° C. by a CVD method of TEOS-TMOP-TMB-$O_3$ system (FIG. 4(c)). Then, the impurity gas (TEOS gas, TMOP gas) is stopped to be supplied while keeping the wafers in the chamber 17, and a SiO$_2$ film 9 having a thickness of 200 Å is deposited on a BPSG film 4 at the substrate temperature of 400° C. (FIG. 5(a)). Next, the wafers are taken out of the chamber 17, and moved to another high temperature processing furnace (not shown).

Figure 5B:
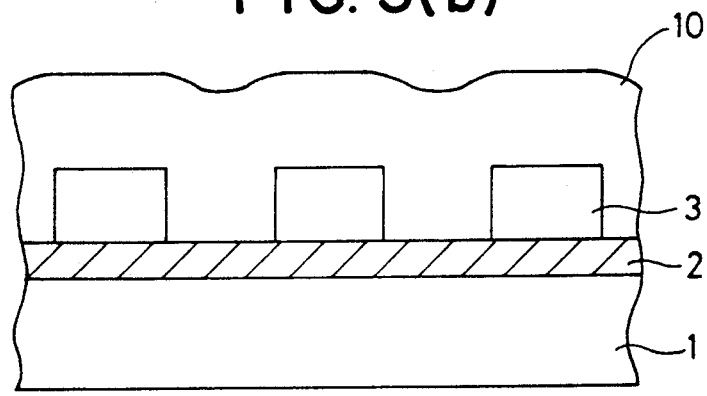

Then, reflow processing is performed at 780° C. for 30 minutes in N$_2$ atmosphere. With this, phosphorus and boron in the BPSG film 8 diffuse into a SiO$_2$ film 9 and a SiO$_2$ film 7 so as to form a BPSG film 10 which reflows, and thus the substrate surface is flattened as shown in FIG. 5(b).

At the same time, the film quality of the heat treated BPSG film 6 is made fine by reflow. Thus, even the film is exposed to the atmosphere in a process thereafter, the BPSG film 6 absorbs moisture and the film quality will never be deteriorated. As described above, according to a manufacturing method in the second embodiment of the present invention, unevenness of the substrate surface is reduced in advance by the SiO$_2$ film 7 having self-flattening property. Thus, the flattening property can be improved further in addition to the effect shown in the first embodiment of the present invention. Besides, a BPSG film has been used as a flattening film for the purpose of description in respective embodiments, but it is a matter of course that the present invention may be applied by using a PSG film in place of the BPSG film. Further, a SiO$_2$ film has been used as a film (a capping film) for covering and protecting the BPSG film, but it is apparent that a BPSG film or a PSG film of low concentration having little hygroscopic property may be used in place of the SiO$_2$ film. Furthermore, it is also possible to have the BPSG film reflow at a temperature lower than the reflow temperature described in the embodiments such as a low temperature at 750° C. or below by increasing the impurity concentration of the BPSG film.

What is claimed is:

1. A method for manufacturing a semiconductor device, consisting essentially of the steps of:
    forming a film having a self-flattening property on an uneven surface of a substrate;
    then directly depositing a SiO$_2$ film doped with impurities to cover said self-flattening film;
    then directly depositing a moisture resistant film to cover said doped SiO$_2$ film; and melting and fluidizing said self-flattening film, said doped SiO$_2$ film and said moisture resistant film by applying heat treatment so as to flatten the surface thereof, whereby the films flow into one another to form a unitary whole film.

2. A method for manufacturing a semiconductor device according to claim 1, wherein
    said self-flattening film is formed by an atmospheric pressure CVD method utilizing TEOS/O$_3$.

3. A method for manufacturing a semiconductor device according to claim 1, wherein
    said doped SiO$_2$ film is a PSG or BPSG film.

4. A method for manufacturing a semiconductor device according to claim 1, wherein
    said moisture resistant film is a SiO$_2$ film or a SiO$_2$ film doped with impurities having lower concentration than that of said doped SiO$_2$ film.

5. A method for manufacturing a semiconductor device according to claim 1, wherein
    after depositing said doped SiO$_2$ film, the step of depositing said moisture resistant film is effected in a state that the device is not exposed to the atmosphere.

6. A method for manufacturing a semiconductor device according to claim 1, wherein
    the thickness of said moisture resistant film is thinner than that of said doped SiO$_2$ film.

* * * * *